(12) United States Patent
Honda et al.

(10) Patent No.: US 11,915,947 B2
(45) Date of Patent: **\*Feb. 27, 2024**

(54) SUBSTRATE PROCESSING APPARATUS AND SUBSTRATE PROCESSING METHOD

(71) Applicant: Tokyo Electron Limited, Tokyo (JP)

(72) Inventors: Takumi Honda, Kumamoto (JP); Koji Yamashita, Kumamoto (JP); Shinji Tahara, Kumamoto (JP); Hironobu Hyakutake, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 155 days.

This patent is subject to a terminal disclaimer.

(21) Appl. No.: 17/644,378

(22) Filed: Dec. 15, 2021

(65) Prior Publication Data
US 2022/0108898 A1    Apr. 7, 2022

Related U.S. Application Data

(63) Continuation of application No. 16/207,337, filed on Dec. 3, 2018, now Pat. No. 11,232,959.

(30) Foreign Application Priority Data

Dec. 4, 2017   (JP) .................................. 2017-232582

(51) Int. Cl.
*H01L 21/67*   (2006.01)
*H01L 21/673*   (2006.01)
(Continued)

(52) U.S. Cl.
CPC .. *H01L 21/67086* (2013.01); *H01L 21/02057* (2013.01); *H01L 21/30604* (2013.01);
(Continued)

(58) Field of Classification Search
None
See application file for complete search history.

(56) References Cited

U.S. PATENT DOCUMENTS 5,278,104 A   1/1994   Kodera et al.
5,887,602 A   3/1999   Iwama
(Continued)

FOREIGN PATENT DOCUMENTS

JP   H01-265522 A   10/1989
JP   H05-200689 A   8/1993
(Continued)

*Primary Examiner* — Sylvia MacArthur
(74) *Attorney, Agent, or Firm* — Pearne & Gordon LLP

(57) ABSTRACT

Substrates can be suppressed from being separated from supporting grooves. A substrate processing apparatus includes a substrate holding unit and a processing tub. The substrate holding unit is configured to hold multiple substrates. The processing tub is configured to store a processing liquid therein. The substrate holding unit comprises a supporting body, an elevating device and a restriction unit. The supporting body has multiple supporting grooves and is configured to support the multiple substrates with a vertically standing posture from below in the multiple supporting grooves, respectively. The elevating device is configured to move the supporting body between a standby position above the processing tub and a processing position within the processing tub. The restriction unit is configured to be moved up and down along with the supporting body by the elevating device and configured to restrict an upward movement of the substrates with respect to the supporting body.

6 Claims, 11 Drawing Sheets

(51) Int. Cl.
 *H01L 21/02* (2006.01)
 *H01L 21/306* (2006.01)

(52) U.S. Cl.
 CPC .. *H01L 21/67057* (2013.01); *H01L 21/67173* (2013.01); *H01L 21/67253* (2013.01); *H01L 21/67313* (2013.01); *H01L 21/67326* (2013.01)

(56) References Cited

U.S. PATENT DOCUMENTS

| | | | |
|---|---|---|---|
| 6,158,596 | A | 12/2000 | Ohtsuka et al. |
| 6,199,564 | B1 | 3/2001 | Yokomizo |
| 6,576,065 | B1* | 6/2003 | Lamure ............ H01L 21/67757 134/76 |
| 6,656,321 | B2 | 12/2003 | Furukawa |
| 7,160,416 | B2 | 1/2007 | Hasegawa et al. |
| 11,232,959 | B2* | 1/2022 | Honda ............ H01L 21/67173 |
| 2001/0003299 | A1* | 6/2001 | Furukawa ............ C03C 15/00 216/99 |
| 2002/0185225 | A1 | 12/2002 | Toshima et al. |
| 2007/0028437 | A1 | 2/2007 | Kimura et al. |
| 2009/0067960 | A1 | 3/2009 | Lee et al. |
| 2009/0158613 | A1 | 6/2009 | Aihara |
| 2019/0172734 | A1 | 6/2019 | Honda et al. |
| 2019/0259639 | A1 | 8/2019 | Nakaoka et al. |
| 2022/0108898 | A1* | 4/2022 | Honda ............ H01L 21/30604 |

FOREIGN PATENT DOCUMENTS

| | | |
|---|---|---|
| JP | H08-107137 A | 4/1996 |
| JP | H10-177979 A | 6/1998 |
| JP | 2001-077080 A | 3/2001 |
| JP | 2008-028272 A | 2/2008 |
| JP | 2013-251383 A | 12/2013 |

* cited by examiner

SUBSTRATE PROCESSING APPARATUS AND SUBSTRATE PROCESSING METHOD

CROSS-REFERENCE TO RELATED APPLICATION

This is a continuation application of U.S. patent application Ser. No. 16/207,337 filed on Dec. 3, 2018, which claims the benefit of Japanese Patent Application No. 2017-232582 filed on Dec. 4, 2017, the entire disclosures of which are incorporated herein by reference.

TECHNICAL FIELD

The various aspects and embodiments described herein pertain generally to a substrate processing apparatus and a substrate processing method.

BACKGROUND

Conventionally, there is known a substrate processing apparatus configured to process a plurality of substrates corresponding to a single lot all at once by immersing the lot in a processing tub in which a processing liquid is stored. The plurality of substrates are immersed in the processing tub while being supported from below by a supporting body having a plurality of supporting grooves such that the substrates are maintained in a vertically standing posture (Patent Document 1).

Patent Document 1: Japanese Patent Laid-open Publication No. H08-107137

In this substrate processing apparatus, however, if it is attempted to immerse the substrates in the processing tub when circulating the processing liquid to generate a flow of the processing liquid within the processing tub or introducing an inert gas into the processing tub, for example, the substrates may float up to be separated from the supporting grooves.

SUMMARY

Exemplary embodiments provide a substrate processing apparatus and a substrate processing method capable of suppressing substrates from being separated from supporting grooves.

In one exemplary embodiment, a substrate processing apparatus includes a substrate holding unit and a processing tub. The substrate holding unit is configured to hold multiple substrates. The processing tub is configured to store a processing liquid therein. The substrate holding unit comprises a supporting body, an elevating device and a restriction unit. The supporting body has multiple supporting grooves and is configured to support the multiple substrates with a vertically standing posture from below in the multiple supporting grooves, respectively. The elevating device is configured to move the supporting body between a standby position above the processing tub and a processing position within the processing tub. The restriction unit is configured to be moved up and down along with the supporting body by the elevating device and configured to restrict an upward movement of the substrates with respect to the supporting body.

According to the exemplary embodiment, it is possible to suppress the substrates from being separated from the supporting grooves.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
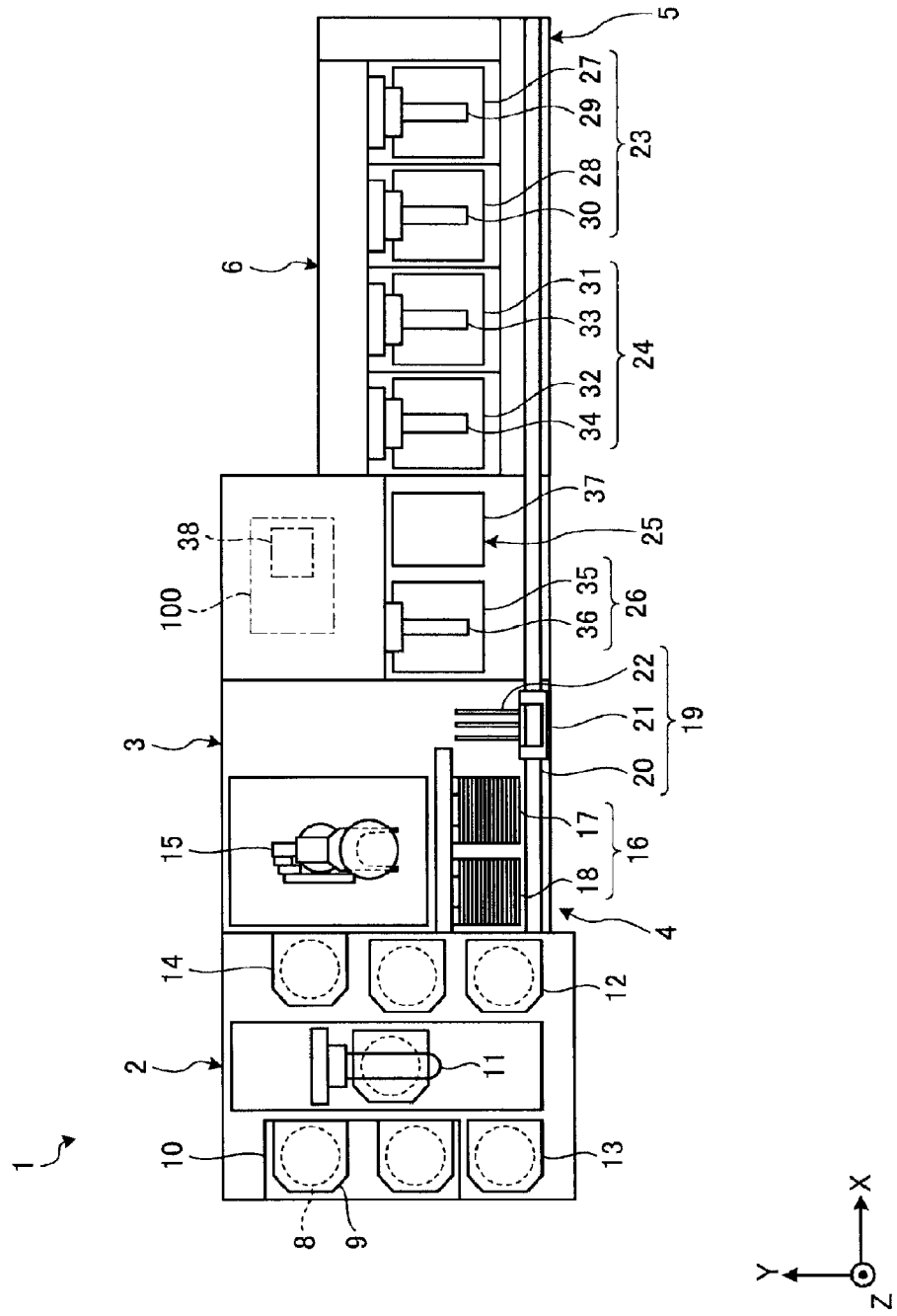
FIG. 1 is a schematic plan view of a substrate processing apparatus according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments of a substrate processing apparatus and a substrate processing method according to the present disclosure will be described in detail with reference to the accompanying drawings. Here, however, it should be noted that the substrate processing apparatus and the substrate processing method of the present disclosure are not limited to the exemplary embodiments. Further, the various exemplary embodiments can be appropriately combined as long as the contents of processings are not contradictory. In the various exemplary embodiments to be described below, same parts will be assigned same reference numerals, and redundant description will be omitted.

First Exemplary Embodiment

[1. Configuration of Substrate Processing Apparatus]

First, a configuration of a substrate processing apparatus according to a first exemplary embodiment will be described with reference to FIG. 1. FIG. 1 is a schematic plan view of the substrate processing apparatus according to the first exemplary embodiment. In the following, in order to clarify positional relationship, the X-axis, the Y-axis and the Z-axis which are orthogonal to each other will be defined, and the positive Z-axis direction will be regarded as a vertically upward direction.

As depicted in FIG. 1, a substrate processing apparatus 1 according to the first exemplary embodiment includes a carrier carry-in/out unit 2, a lot forming unit 3, a lot placing unit 4, a lot transferring unit 5, a lot processing unit 6 and a control unit 100.

The carrier carry-in/out unit 2 is configured to perform a carry-in and a carry-out of a carrier 9 in which a plurality (e.g., 25 sheets) of substrates (silicon wafers) 8 are vertically arranged in a horizontal posture.

The carrier carry-in/out unit 2 is equipped with a carrier stage 10 configured to place multiple carriers 9 thereon; a carrier transfer device 11 configured to transfer the carrier 9; carrier stocks 12 and 13 configured to place therein the carrier 9 temporarily; and a carrier placing table 14 configured to place the carrier 9 thereon.

The carrier carry-in/out unit 2 transfers the carrier 9, which is carried onto the carrier stage 10 from outside, to the carrier stock 12 or the carrier placing table 14 by using the carrier transfer device 11. That is, the carrier carry-in/out unit 2 transfers the carrier 9, which accommodates therein the plurality of substrates 8 before being processed by the lot processing unit 6, to the carrier stock 12 or the carrier placing table 14.

The carrier stock 12 temporarily stores therein the carrier 9 in which the plurality of substrates 8 before being processed by the lot processing unit 6 are accommodated.

The plurality of substrates 8 are carried out by a substrate transfer device 15 to be described later from the carrier 9 which is transferred onto the carrier placing table 14 and accommodates therein the plurality of substrates 8 before being processed by the lot processing unit 6.

Further, the plurality of substrates 8 after being processed by the lot processing unit 6 are carried, by using the substrate transfer device 15, into a carrier 9 which is placed on the carrier placing table 14 and does not accommodate therein the substrates 8.

The carrier carry-in/out unit 2 transfers the carrier 9, which is placed on the carrier placing table 14 and accommodates therein the plurality of substrates 8 after being processed by the lot processing unit 6, to the carrier stock 13 or the carrier stage 10 by using the carrier transfer device 11.

The carrier stock 13 temporarily stores therein the plurality of substrates 8 after being processed by the lot processing unit 6. The carrier 9 transferred to the carrier stage 10 is carried to the outside.

The lot forming unit 3 is equipped with the substrate transfer device 15 configured to transfer the plurality (e.g., 25 sheets) of substrates 8. The lot forming unit 3 performs a transfer of the plurality (e.g., 25 sheets) of substrates 8 twice by the substrate transfer device 15, and forms a lot composed of a multiple number (e.g., 50 sheets) of substrates 8.

The lot forming unit 3 transfers the multiple number of substrates 8 to the lot placing unit 4 from carriers 9 placed on the carrier placing table 14 by using the substrate transfer device 15 to form the lot by placing the multiple number of substrates 8 in the lot placing unit 4.

The multiple number of substrates 8 constituting the lot are processed by the lot processing unit 6 at the same time. When forming the lot, the multiple number of substrates 8 may be arranged such that pattern formation surfaces thereof face each other or such that the pattern formation surfaces all face to one direction.

Further, by using the substrate transfer device 15, the lot forming unit 3 transfers the multiple number of substrates 8 into the carriers 9 from the lot after being processed by the lot processing unit 6 to be placed in the lot placing unit 4.

The substrate transfer device 15 is equipped with, as a substrate supporting unit configured to support the plurality of substrates 8, two types of substrate supporting units: a before-processed substrate supporting unit (not shown) configured to support the plurality of substrates 8 before being processed; and an after-processed substrate supporting unit (not shown) configured to support the plurality of substrates 8 after being processed. With this configuration, particles or the like adhering to the substrates 8 before being processed may be suppressed from adhering to the substrates 8 after being processed.

The substrate transfer device 15 is configured to change a posture of the plurality of substrates 8 from a horizontal posture to a vertical posture and from the vertical posture to the horizontal posture while transferring the substrates 8. Here, the horizontal posture refers to a state in which the substrate 8 is laid horizontally, and the vertical posture refers to a state in which the substrate 8 stands upright.

In the lot placing unit 4, the lot transferred between the lot forming unit 3 and the lot processing unit 6 by the lot transferring unit 5 is temporarily placed (stands by) on the lot placing table 16.

The lot placing unit 4 is equipped with a carry-in side lot placing table 17 and a carry-out side lot placing table 18.

The lot before being processed is placed on the carry-in side lot placing table 17. The lot after being processed is placed on the carry-out side lot placing table 18.

On each of the carry-in side lot placing table 17 and the carry-out side lot placing table 18, the multiple number of substrates 8 corresponding to the single lot are arranged in a forward-backward direction with the vertical posture.

The lot transferring unit 5 is configured to transfer the lot between the lot placing unit 4 and the lot processing unit 6 and within the lot processing unit 6.

The lot transferring unit 5 is equipped with a lot transfer device 19 configured to transfer the lot. The lot transfer device 19 includes a rail 20 extended along the lot placing unit 4 and the lot processing unit 6; and a moving body 21 configured to be moved along the rail 20 while holding the lot.

The moving body 21 is provided with a substrate holding body 22 configured to hold the lot composed of the multiple number of substrates 8 arranged in the forward-backward direction with the vertical posture.

The lot transferring unit 5 receives the lot placed on the carry-in side lot placing table 17 with the substrate holding body 22 of the lot transfer device 19, and delivers the received lot to the lot processing unit 6.

Further, the lot transferring unit 5 receives the lot processed by the lot processing unit 6 with the substrate holding unit 22 of the lot transfer device 19, and delivers the received lot onto the carry-out side lot placing table 18.

Further, the lot transferring unit 5 performs a transfer of the lot within the lot processing unit 6 by using the lot transfer device 19.

The lot processing unit 6 is configured to perform a processing such as etching, cleaning or drying on the lot composed of the multiple number of substrates 8 arranged in the forward-backward direction with the vertical posture.

The lot processing unit 6 includes an etching apparatus 23 configured to perform an etching processing on the lot; a cleaning apparatus 24 configured to perform a cleaning processing on the lot; a substrate holding body cleaning apparatus 25 configured to perform a cleaning processing on the substrate holding body 22; and a drying apparatus 26 configured to perform a drying processing on the lot. Here, the number of the etching apparatus 23 is not merely limited to one but may be two or more.

The etching apparatus 23 is equipped with a processing tub 27 for etching; a processing tub 28 for rinsing; and substrate holding units 29 and 30.

The processing tub 27 for etching is configured to store therein a processing liquid for etching (hereinafter, referred to as "etching liquid"). The processing tub 28 for rinsing is configured to store therein a processing liquid for rinsing (e.g., pure water). Details of the processing tub 27 for etching will be elaborated later.

Each of the substrate holding units 29 and 30 holds the multiple number of substrates 8 constituting the lot such that the substrates 8 are arranged in the forward-backward direction with the vertical posture.

The etching apparatus 23 receives the lot from the substrate holding body 22 of the lot transfer device 19 with the substrate holding unit 29, and by lowering the substrate holding unit 29, the received lot is immersed in the etching liquid stored in the processing tub 27, so that the etching processing is performed.

Thereafter, the etching apparatus 23 takes out the lot from the processing tub 27 by raising the substrate holding unit 29, and delivers the taken lot to the substrate holding body 22 of the lot transfer device 19 from the substrate holding unit 29.

Then, the lot is received by the substrate holding unit 30 from the substrate holding body 22 of the lot transfer device 19, and by lowering the substrate holding unit 30, the lot is immersed in the processing liquid for rinsing stored in the processing tub 28, so that a rinsing processing is performed.

Thereafter, the etching apparatus 23 takes out the lot from the processing tub 28 by raising the substrate holding unit 30, and the lot is then delivered from the substrate holding unit 30 to the substrate holding body 22 of the lot transfer device 19.

The cleaning apparatus 24 includes: a processing tub 31 for cleaning; a processing tub 32 for rinsing; and substrate holding units 33 and 34.

The processing tub 31 for cleaning is configured to store therein a processing liquid for cleaning (e.g., SC1). The processing tub 32 for rinsing is configured to store therein a processing liquid for rinsing (e.g., pure water). Each of the substrate holding units 33 and 34 is configured to hold the multiple number of substrates 8 corresponding to the single lot while arranging the substrates 8 in the forward-backward direction with the vertical posture.

The drying apparatus 26 is equipped with a processing tub 35 and a substrate holding unit 36 configured to be moved up and down with respect to the processing tub 35.

A processing gas for drying (e.g., IPA (isopropyl alcohol)) is supplied into the processing tub 35. The substrate holding unit 36 is configured to hold the multiple number of substrates 8 corresponding to the single lot while keeping the substrates 8 arranged in the forward-backward direction with the vertical posture.

The drying apparatus 26 receives the lot from the substrate holding body 22 of the lot transfer device 19 with the substrate holding unit 36, and carries the received lot into the processing tub 35 by lowering the substrate holding unit 36, and performs the drying processing on the lot with the processing gas for drying supplied into the processing tub 35. Further, the drying apparatus 26 raises the substrate holding unit 36 and delivers the lot after being subjected to the drying processing to the substrate holding body 22 of the lot transfer device 19 from the substrate holding unit 36.

The substrate holding body cleaning apparatus 25 is equipped with a processing tub 37 and is configured to supply a processing liquid for cleaning and a drying gas into the processing tub 37. By supplying the drying gas after supplying the processing liquid for cleaning to the substrate holding body 22 of the lot transfer device 19, the cleaning processing upon the substrate holding body 22 is performed.

The control unit 100 controls operations of individual components (the carrier carry-in/out unit 2, the lot forming unit 3, the lot placing unit 4, the lot transferring unit 5 and the lot processing unit 6) of the substrate processing apparatus 1. The control unit 100 controls the operations of the individual components of the substrate processing apparatus 1 based on signals from a switch or the like.

The control unit 100 may be implemented by, for example, a computer and includes various kinds of circuits and a microcomputer including a CPU (Central Processing Unit), ROM (Read Only Memory), RAM (Random Access Memory), an input/output port, and so forth. The control unit 100 has a computer-readable recording medium 38. The recording medium 38 is configured to store therein programs for controlling various types of processings performed in the substrate processing apparatus 1.

The control unit 100 controls the operation of the substrate processing apparatus 1 as the CPU executes the programs stored in the recording medium 38 while using the ROM as a work area. Further, the programs are stored in the compute-readable recording medium 38, and may be installed to the recording medium 38 of the control unit 100 from another recording medium.

The computer-readable recording medium 38 may include, by way of example, a hard disk HD, a flexible disk FD, a compact disk CD, a magnet optical disk MO, a memory card, or the like.

[2. Configuration of Processing Tub]

Figure 2:
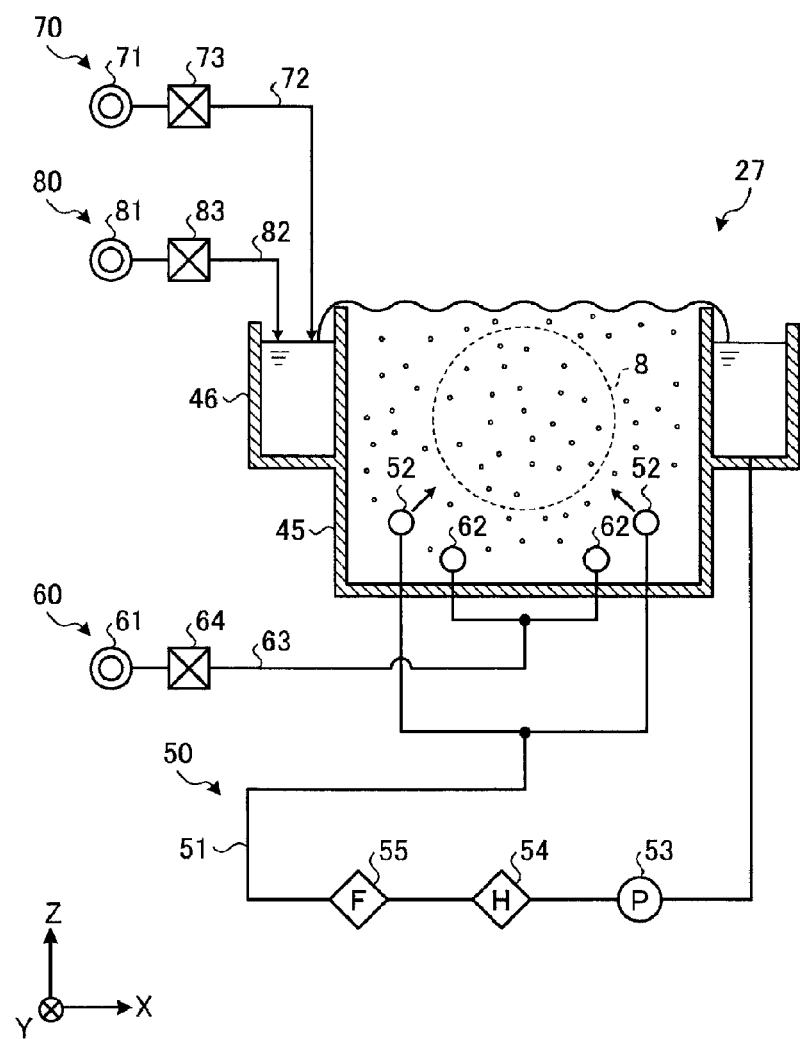
FIG. 2 is a diagram illustrating a configuration of a processing tub for etching according to the first exemplary embodiment.

Now, a configuration of the processing tub 27 for etching will be explained with reference to FIG. 2. FIG. 2 is a diagram illustrating the configuration of the processing tub 27 for etching according to the first exemplary embodiment.

In the processing tub 27 for etching, between a nitride film (SiN) and an oxide film ($SiO_2$) formed on the substrate 8, only the nitride film is selectively etched by using the etching liquid. In the etching processing on the nitride film, a phosphoric acid ($H_3PO_4$) aqueous solution is used as the etching liquid.

The processing tub 27 for etching includes an inner tub 45 and an outer tub 46. The processing tub 27 is also equipped with a circulation unit 50, a gas supply unit 60, a phosphoric acid aqueous solution supply unit 70 and a pure water supply unit 80.

The inner tub 45 has an open top and stores the etching liquid therein. The lot (the multiple number of substrates 8) is immersed in the inner tub 45.

The outer tub 46 has an open top and is disposed around an upper portion of the inner tub 45. The outer tub 46 stores therein the etching liquid overflowing from the inner tub 45. Further, the phosphoric acid aqueous solution and the pure water are respectively supplied into the outer tub 46 from the phosphoric acid aqueous solution supply unit 70 and the pure water supply unit 80 to be described later.

The circulation unit 50 is configured to circulate the etching liquid between the inner tub 45 and the outer tub 46. The circulation unit 50 is equipped with a circulation line 51, a processing liquid supply nozzle 52, a pump 53, a heater 54 and a filter 55.

The circulation line 51 connects the outer tub 46 and the inner tub 45. One end of the circulation line 51 is connected to the outer tub 46, and the other end of the circulation line 51 is connected to the processing liquid supply nozzle 52 which is provided within the inner tub 45.

The pump 53, the heater 54 and the filter 55 are provided at the circulation line 51. The pump 53 is configured to send the etching liquid within the outer tub 46 into the circulation line 51. The heater 54 is configured to heat the etching liquid flowing in the circulation line 51 to a temperature suitable for the etching processing. The filter 55 is configured to remove impurities from the etching liquid flowing in the circulation line 51. Further, the pump 53, the heater 54 and the filter 55 are provided in this sequence from the upstream side.

The circulation unit 50 supplies the etching liquid from the outer tub 46 into the inner tub 45 via the circulation line 51. The etching liquid supplied into the inner tub 45 is flown back into the outer tub 46 as it overflows from the inner tub 45. Accordingly, the etching liquid is circulated between the inner tub 45 and the outer tub 46.

Further, the circulation unit 50 may set the etching liquid in a boiling state by heating the etching liquid with the heater 54.

The gas supply unit 60 is configured to generate bubbles in the etching liquid within the inner tub 45 by supplying a gas into the inner tub 45.

The gas supply unit 60 is equipped with a gas source 61, a gas supply nozzle 62, a gas supply line 63 and a first flow rate controller 64. The gas source 61 is a tank which stores the gas therein. Here, though the gas source 61 stores therein nitrogen, the gas stored in the gas source 61 may be an inert gas (helium, argon, or the like) other than the nitrogen or may be a gas other than the inert gas.

The gas supply nozzle 62 is provided within the inner tub 45. The gas supply line 63 connects the gas source 61 and the gas supply nozzle 62. The gas supply line 63 is provided with, by way of non-limiting example, an opening/closing valve, a flow rate control valve, a flowmeter, and so forth, and is configured to adjust a flow rate of the nitrogen supplied into the gas supply nozzle 62 from the gas source 61.

The gas supply unit 60 is configured as described above, and the nitrogen stored in the gas source 61 is supplied into the gas supply nozzle 62 via the gas supply line 63. The nitrogen supplied to the gas supply nozzle 62 is then discharged from the gas supply nozzle 62 into the etching liquid within the inner tub 45 in the form of bubbles of the nitrogen. Accordingly, the gas supply unit 60 generates bubbles in the etching liquid within the inner tub 45.

Further, in order to generate finer bubbles, the gas supply unit 60 may be equipped with a bubble generating unit composed of, by way of example, a porous member.

The phosphoric acid aqueous solution supply unit 70 includes a phosphoric acid aqueous solution source 71, a phosphoric acid aqueous solution supply line 72, and a second flow rate controller 73. The phosphoric acid aqueous solution source 71 is a tank which stores therein the phosphoric acid aqueous solution. The phosphoric acid aqueous solution supply line 72 is connected to the phosphoric acid aqueous solution source 71 and supplies the phosphoric acid aqueous solution from the phosphoric acid aqueous solution source 71 into the outer tub 46.

The second flow rate controller 73 is provided with, by way of example, an opening/closing valve, a flow rate control valve, a flowmeter, and so forth, and is configured to adjust a flow rate of the phosphoric acid aqueous solution supplied from the phosphoric acid aqueous solution source 71 into the outer tub 46.

The pure water supply unit 80 is configured to supply pure water (DIW: deionized water) into the outer tub 46 to supplement moisture that has evaporated from the etching liquid when the etching liquid is heated. The pure water supply unit 80 is equipped with a pure water source 81, a pure water supply line 82 and a third flow rate controller 83.

The pure water source 81 is a tank which stores therein the pure water. The pure water supply line 82 connects the pure water source 81 and the outer tub 46, and supplies the pure water from the pure water source 81 into the outer tub 46. The third flow rate controller 83 is provided with, by way of example, an opening/closing valve, a flow rate control valve, a flowmeter, and so forth, and is configured to adjust a flow rate of the pure water supplied from the pure water source 81 into the outer tub 46.

[3. Configuration of Substrate Holding Unit]

Figure 3:
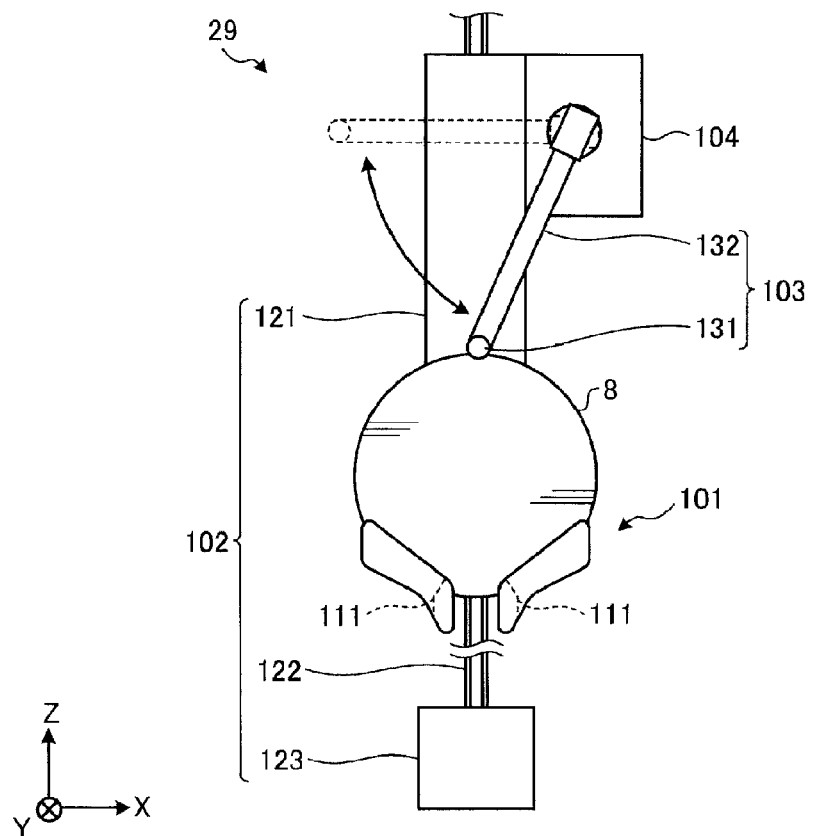
FIG. 3 is a diagram illustrating a configuration of a substrate holding unit according to the first exemplary embodiment.

Now, a configuration of the substrate holding unit 29 will be described with reference to FIG. 3. FIG. 3 is a diagram illustrating the configuration of the substrate holding unit 29 according to the first exemplary embodiment.

As depicted in FIG. 3, the substrate holding unit 29 includes a supporting body 101, an elevating device 102, a restriction unit 103, and a moving device 104. The substrate holding unit 29 is disposed above the aforementioned processing tub 27.

Figure 4:
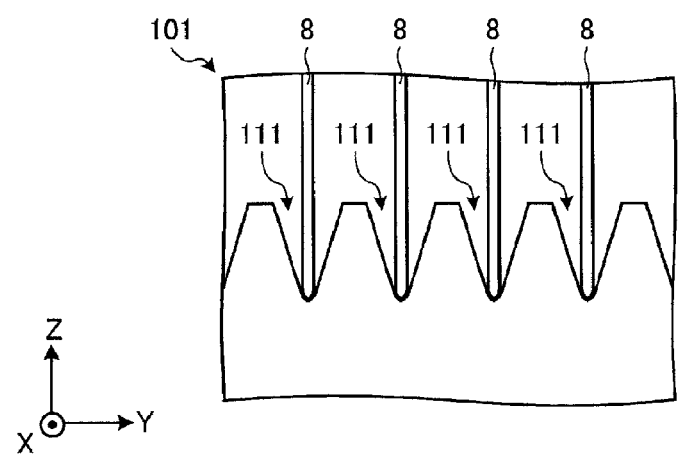
FIG. 4 is a diagram illustrating a configuration of a supporting body according to the first exemplary embodiment.

The supporting body 101 has a multiple number of supporting grooves 111 and supports each of the multiple number of substrates 8 with the vertically standing posture from below in the corresponding one of the supporting grooves 111. Here, a configuration of the supporting body 101 will be explained with reference to FIG. 4. FIG. 4 is a diagram illustrating the configuration of the supporting body 101 according to the first exemplary embodiment.

As depicted in FIG. 4, the multiple number of supporting grooves 111 of the supporting body 101 are arranged at a regular distance therebetween along a horizontal direction (here, Y-axis direction). Each supporting groove 111 has a substantially V-shape a width of which is narrowed as it goes downwards. Thus, the supporting body 101 has a comb-teeth shape formed by the multiple number of supporting grooves 111.

The substrates 8 are supported at the supporting grooves 111 in one-to-one correspondence. Accordingly, the substrates 8 are supported by the supporting body 101 while being arranged at the regular distance in the same direction (Y-axis direction) as the arrangement direction of the supporting grooves 111.

The elevating device 102 is equipped with a main body 121, an elevation shaft 122 and a driving unit 123. The main body 121 is connected to the elevation shaft 122. The elevation shaft 122 is, for example, a screw shaft in a ball screw mechanism, and is extended in the vertical direction. The driving unit 123 is, by way of non-limiting example, a motor and is configured to move the main body 121 up and down along the elevation shaft 122.

The elevating device 102 moves up and down the supporting body 101 fixed to a lower portion of the main body 121 by moving the main body 121 up and down through the driving unit 123. To elaborate, the elevating device 102 moves the supporting body 101 up and down between a standby position above the processing tub 27 and a processing position within the processing tub 27.

The restriction unit 103 is disposed above the supporting body 101 and is configured to restrict an upward movement of the substrates 8 with respect to the supporting body 101.

The restriction unit 103 is equipped with a restriction member 131 and a supporting arm 132 configured to support the restriction member 131 at one end thereof. The other end of the supporting arm 132 is connected to the moving device 104. A specific configuration of the restriction unit 103 will be elaborated later.

The moving device 104 includes, by way of non-limiting example, a motor. This moving device 104 is configured to move the restriction member 131 between a restriction position (indicated by a solid line in FIG. 3) where the restriction member 131 is capable of restricting the upward movement of the substrates 8 and a non-restriction position (indicated by a dashed line in FIG. 3) different from the restriction position. Here, as shown in FIG. 3, the non-restriction position is set to be located above the restriction position. However, the non-restriction position need not necessarily be a position above the restriction position as long as the transfer of the substrates 8 to the substrate holding unit 29 is not hampered.

In the first exemplary embodiment, the moving device 104 moves the restriction member 131 supported by the supporting arm 132 between the restriction position and the non-restriction position by rotating the supporting arm 132 around a horizontal axis (Y-axis) at a preset angle.

By way of example, in the state that the restriction unit 103 is placed at the non-restriction position, the moving device 104 moves the restriction member 131 to the restriction position by rotating the restriction unit 103 at the preset angle in the counterclockwise direction. Further, in the state that the restriction unit 103 is placed at the restriction position, the moving device 104 moves the restriction member 131 to the non-restriction position by rotating the restriction unit 103 at the preset angle in the clockwise direction.

Like the supporting body 101, the moving device 104 is connected to the main body 121 of the elevating device 102. Accordingly, the restriction unit 103 supported by the moving device 104 is moved up and down as one body with the supporting body 101 by the elevating device 102.

Further, the moving device 104 need not necessarily have the configuration in which the restriction unit 103 is rotated. By way of example, the moving device 104 may have a configuration in which the restriction member 131 is moved between the restriction position and the non-restriction position by moving the restriction unit 103 up and down along the vertical axis.

Figure 5:
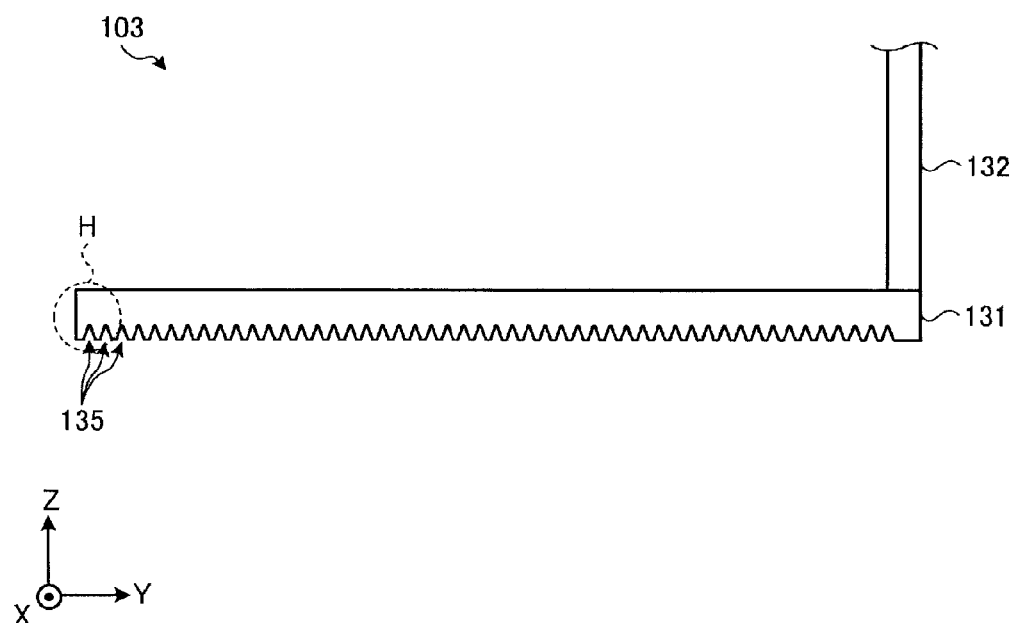
FIG. 5 is a diagram illustrating a configuration of a restriction unit according to the first exemplary embodiment.
Figure 6:
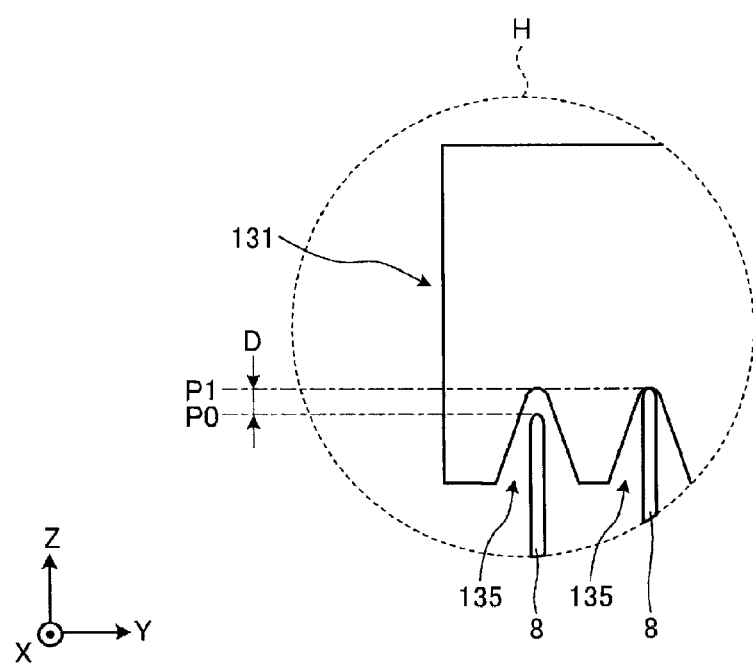
FIG. 6 is an enlarged view of a portion H shown in FIG. 5.

Now, the configuration of the restriction unit 103 will be discussed with reference to FIG. 5 and FIG. 6. FIG. 5 is a diagram illustrating the configuration of the restriction unit 103 according to the first exemplary embodiment. FIG. 6 is an enlarged view of a portion H shown in FIG. 5.

As illustrated in FIG. 5, the restriction member 131 is a rod-shaped member extended in the horizontal direction. The restriction member 131 is extended in the arrangement direction of the supporting grooves 111 of the supporting body 101, that is, in the Y-axis direction which is the horizontal direction identical to the arrangement direction of the multiple number of substrates 8.

The supporting arm 132 is a rod-shaped member configured to support the restriction member 131 horizontally, and is extended in a direction perpendicular to the restriction member 131. Desirably, the restriction member 131 and the supporting arm 132 are made of a member which is excellent in heat resistance and strength. By way of non-limiting example, the restriction member 131 and the supporting arm 132 may be made of quartz.

The restriction member 131 has a multiple number of restriction grooves 135. When the restriction member 131 is placed at the restriction position (indicated by the solid line in FIG. 3), upper portions of the substrates 8 supported by the supporting body 101 are accommodated into the restriction grooves 135, so that the upward movement of the substrates 8 is restricted.

The multiple number of restriction grooves 135 are formed along an extension direction of the restriction member 131 (that is, the Y-axis direction). Further, the multiple number of restriction grooves 135 are arranged at the same interval as that of the multiple number of supporting grooves 111 of the supporting body 101. Each restriction groove 135 has a substantially V-shape a width of which is narrowed as it goes upwards.

As illustrated in FIG. 6, in the state that the restriction member 131 is placed at the restriction position, the upper portions of the multiple number of substrates 8 are respectively placed within the restriction grooves 135. The restriction member 131 is placed at a position where it is not in contact with the substrates 8 appropriately supported at the supporting body 101, like the substrate 8 on the left side of FIG. 6.

To elaborate, in the state that the restriction member 131 is placed at the restriction position, a top surface of the restriction groove 135 is located at a contact position P1 which is upwardly spaced apart by a distance D from an upper end position (hereinafter, referred to as "supported position P0") of the substrate 8 appropriately supported at the supporting body 101. Further, an inclined surface of the restriction groove 135 is located at a position spaced apart by a preset distance from the substrate 8 appropriately supported at the supporting body 101.

Assume that the substrate 8 supported at the supporting body 101 is distanced apart from the supporting body 101 to be moved up (floats) (see the substrate 8 on the right side of FIG. 6). In this case, at a time when the substrate 8 floats from the supported position P0 by the distance D, that is, at a time when the upper end of the substrate 8 reaches the contact position P1, the substrate 8 comes into contact with the top surface of the restriction groove 135, so that the upward movement of the substrate 8 beyond the contact position P1 is restricted. Further, the distance D is set to be less than a depth of the supporting groove 111 formed at the supporting body 101.

As stated above, the substrate holding unit 29 according to the first exemplary embodiment is equipped with the restriction unit 103 configured to restrict the upward movement of the substrates 8 with respect to the supporting body 101. Accordingly, when immersing the substrates 8 in the processing tub 27 or when a processing is performed after the substrates 8 are immersed therein, the substrates 8 can be suppressed from floating up to be separated from the supporting grooves 111.

Further, the restriction unit 103 is equipped with the multiple number of restriction grooves 135 in which the upper portions of the multiple number of substrates 8 supported at the supporting body 101 are accommodated when the restriction unit 103 is placed at the restriction position. With this configuration, tilting of the substrates 8 as well as the upward movement thereof can be restricted. Accordingly, reduction of a distance between the substrates 8 or contact between the substrates 8, which might be caused when the substrates 8 are tilted, can be suppressed. That is, an interval between the substrates 8 can be maintained constant.

Furthermore, the restriction position is a position which is not in contact with the substrates 8 supported at the supporting body 101. When the substrates 8 are moved upwards after being distanced apart from the supporting body 101, the restriction unit 103 placed at the restriction position restricts the upward movement of the substrates 8 by coming into contact with the upper portions of the substrates 8. When the substrates 8 are appropriately supported at the supporting body 101, the restriction unit 103 does not come into contact with the substrates 8. Accordingly, as compared to a case where the substrates 8 are constantly pressed, particle generation that might be caused by the contact between the substrates 8 and the restriction unit 103 can be suppressed.

[4. Operation of Substrate Holding Unit]

Figure 7:
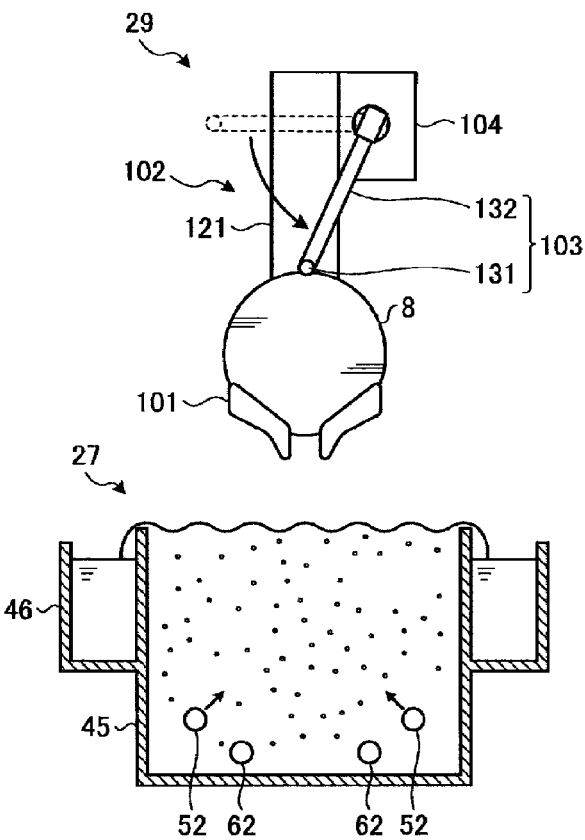
FIG. 7 is an explanatory diagram illustrating an operation of the substrate holding unit.
Figure 8:
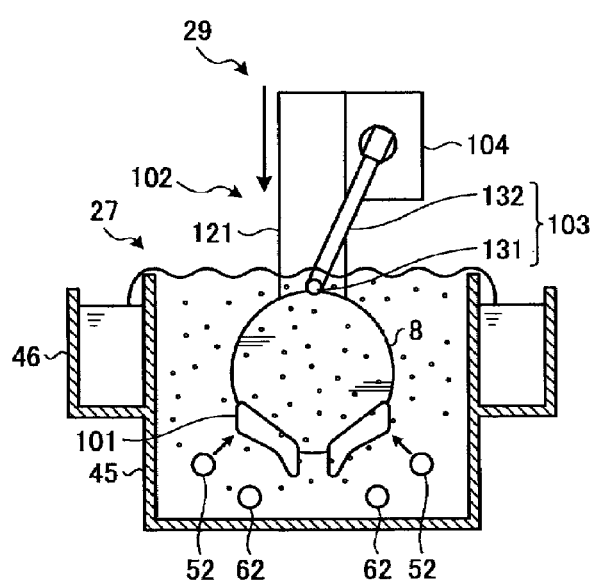
FIG. 8 is an explanatory diagram illustrating the operation of the substrate holding unit.

Now, a specific operation of the above-described substrate holding unit 29 will be explained with reference to FIG. 7 and FIG. 8. FIG. 7 and FIG. 8 are explanatory diagrams illustrating the operation of the substrate holding unit 29. Further, operations of the elevating device 102 and the restriction unit 103 belonging to the substrate holding unit 29 are controlled by the control unit 100.

As depicted in FIG. 7, in the etching apparatus 23, the multiple number of substrates 8 are delivered to the substrate holding unit 29 from the lot transfer device 19 (see FIG. 1). Accordingly, the substrates 8 are supported at the supporting body 101, that is, arranged at the regular distance therebetween in the horizontal direction with the vertically standing posture. Then, the control unit 100 controls the moving device 104 to move the restriction unit 103 from the non-restriction position to the restriction position.

The substrate holding unit 29 is equipped with the moving device 104 configured to move the restriction unit 103 between the restriction position and the non-restriction position. With this configuration, when delivering the substrates 8 to the substrate holding unit 29, the restriction unit 103 can be retreated to the non-restriction position where it does not interfere with the delivery of the substrates. Thus, the substrates 8 can be delivered to the substrate holding unit 29 easily.

Thereafter, as shown in FIG. 8, the control unit 100 controls the elevating device 102 to move the substrate holding unit 29 to the processing position within the processing tub 27.

Upon the completion of the processing in the processing tub 27, the control unit 100 controls the elevating device 102 to move the substrate holding unit 29 from the processing position to the standby position. Then, the control unit 100 controls the moving device 104 to move the restriction unit 103 from the restriction position to the non-restriction position. Afterwards, the substrates 8 are delivered to the lot transfer device 19 from the substrate holding unit 29.

As stated above, the control unit 100 controls the moving device 104 to move the restriction unit 103 from the non-restriction position to the restriction position before the substrates 8 supported by the supporting body 101 are immersed in the etching liquid stored in the processing tub 27. Accordingly, even in a time period taken before the substrates 8 reach the processing position after the substrates 8 come into contact with the etching liquid, disorder of the arrangement of the substrates 8 can be suppressed.

Further, the control unit 100 may keep the restriction unit 103 in the etching liquid within the processing tub 27 until a next processing is begun after the substrates 8 are delivered to the lot transfer device 19. By doing so, precipitation of silicon which might be caused when the restriction unit 103 is dried can be suppressed.

In the present exemplary embodiment, the restriction unit 103 is moved to the restriction position before the substrates 8 are immersed in the etching liquid. However, the timing for moving the restriction unit 103 to the restriction position may not be limited to the mentioned example. By way of example, the control unit 100 may move the restriction unit 103 to the restriction position during the time period before the substrates 8 reach the processing position after the substrates 8 come into contact with the etching liquid. Further, the control unit 100 may move the restriction unit 103 to the restriction position after the substrates 8 reach the processing position.

As stated above, the etching apparatus 23 (an example of the substrate processing apparatus) according to the first exemplary embodiment is equipped with the substrate holding unit 29 and the processing tub 27. The substrate holding unit 29 holds the multiple number of substrates 8. The processing tub 27 stores the etching liquid (an example of the processing liquid) therein. Further, the substrate holding unit 29 is equipped with the supporting body 101, the elevating device 102 and the restriction unit 103. The supporting body 101 is provided with the multiple number of supporting grooves 111 and supports the multiple number of substrates 8 with the vertically standing posture from below in the supporting grooves 111. The elevating device 102 moves the supporting body 101 up and down between the standby position above the processing tub 27 and the processing position within the processing tub. The restriction unit 103 is moved up and down along with the supporting body 101 by the elevating device 102 and restricts the upward movement of the substrates 8 with respect to the supporting body 101.

Thus, in the etching apparatus 23 according to the first exemplary embodiment, the separation of the substrates 8 from the supporting grooves 111 can be suppressed. Particularly, the separation of the substrates 8 from the supporting grooves 111 which may be caused by the flow of the etching liquid formed by the circulation unit 50, the bubbling by the gas supplied from the gas supply nozzle 62 or the boiling of the etching liquid by the heater 54 can be appropriately suppressed.

Moreover, in the etching apparatus 23 according to the first exemplary embodiment, by providing the restriction unit 103 at the substrate holding unit 29, the upward movement of the substrates 8 with respect to the supporting body 101 can be restricted even before the substrates 8 are immersed in the processing liquid within the processing tub 27. Accordingly, it is possible to suppress the disorder of the arrangement of the substrates 8 during the time period taken before the substrate 8 reach the processing position after they come into contact with the etching liquid.

Second Exemplary Embodiment

Now, a second exemplary embodiment will be explained. FIG. 9A to FIG. 9E are explanatory diagrams illustrating an operation of the etching apparatus 23 according to the second exemplary embodiment. In the following description, the same parts as those already described above will be assigned same reference numerals, and redundant description will be omitted.

Figure 9A:
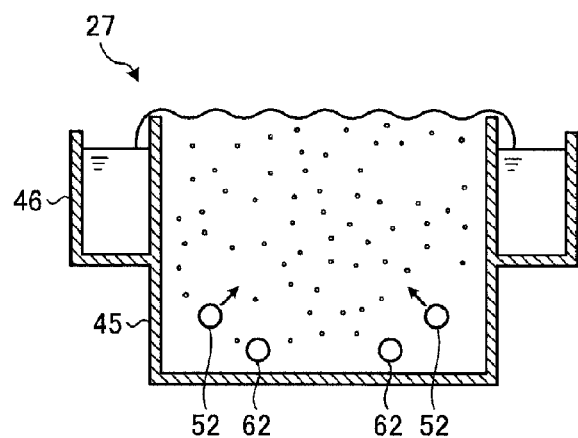
FIG. 9A is an explanatory diagram illustrating an operation of an etching apparatus according to a second exemplary embodiment.

As depicted in FIG. 9A, in the processing tub 27, the etching liquid stored in the inner tub 45 is shaken due to the flow of the etching liquid formed by the circulation unit 50 (see FIG. 2) and the bubbling by the gas supplied from the gas supply nozzle 62 (see FIG. 2).

Figure 9B:
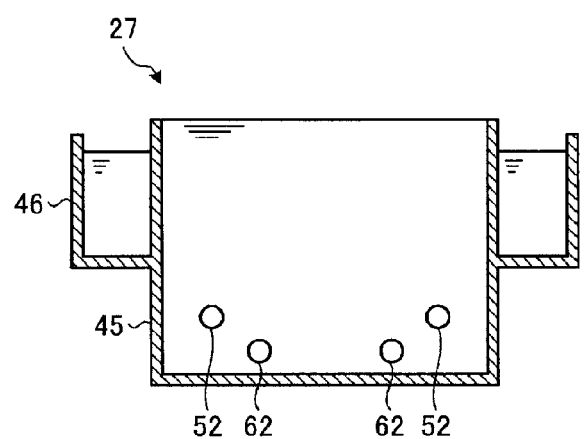
FIG. 9B is an explanatory diagram illustrating the operation of the etching apparatus according to the second exemplary embodiment.

Accordingly, as shown in FIG. 9B, before the multiple number of substrates 8 are immersed in the etching liquid, the control unit 100 may control the circulation unit 50 and the gas supply unit 60 to respectively stop the flow of the etching liquid by the circulation unit 50 and the bubbling by the gas supply unit 60. To elaborate, the control unit 100 stops the pump 53 provided at the circulation unit 50. Further, the control unit 100 controls the first flow rate controller 64 provided at the gas supply unit 60 to set the flow rate of the gas supplied from the gas source 61 to become zero (0).

Figure 9C:
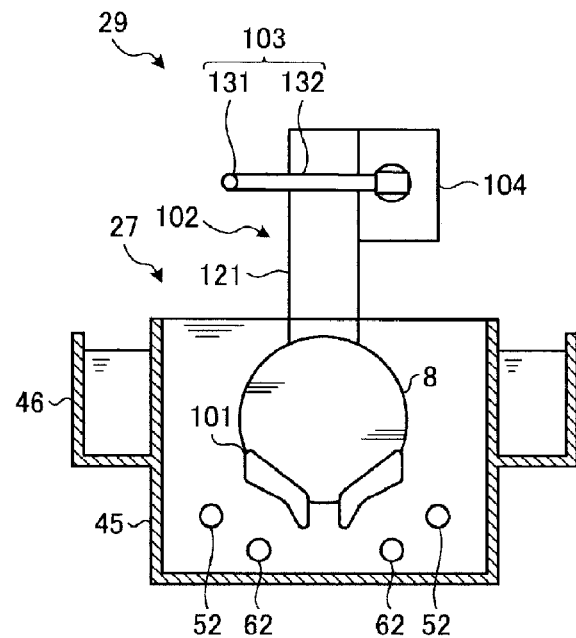
FIG. 9C is an explanatory diagram illustrating the operation of the etching apparatus according to the second exemplary embodiment.
Figure 9D:
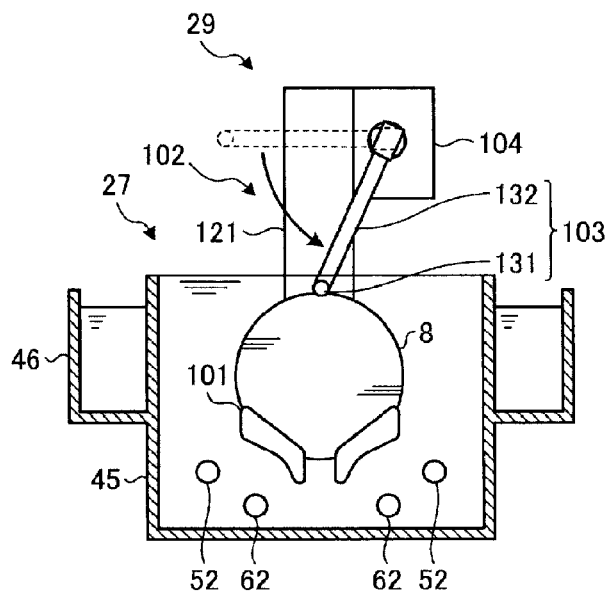
FIG. 9D is an explanatory diagram illustrating the operation of the etching apparatus according to the second exemplary embodiment.

Then, upon a lapse of a predetermined time which is set as a time required for the shaking of the etching liquid to be stopped, the control unit 100 controls the elevating device 102 to move the multiple number of substrates 8 to the processing position from the standby position, as illustrated in FIG. 9C. At this time, the restriction unit 103 is located at the non-restriction position. If the substrates 8 reach the processing position, the control unit 100 controls the moving device 104 to move the restriction unit 103 from the non-restriction position to the restriction position, as shown in FIG. 9D.

Figure 9E:
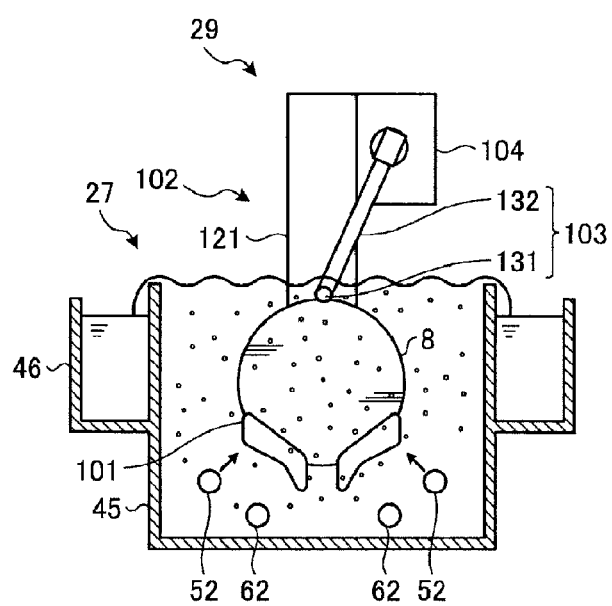
FIG. 9E is an explanatory diagram illustrating the operation of the etching apparatus according to the second exemplary embodiment.

Then, as depicted in FIG. 9E, the control unit 100 controls the circulation unit 50 and the gas supply unit 60 to resume the circulation of the etching liquid by the circulation unit 50 and the bubbling by the gas supply unit 60.

As stated above, before the multiple number of substrates 8 supported by the supporting body 101 are immersed in the etching liquid stored in the processing tub 27, the control unit 100 may control the circulation unit 50 and the gas supply unit 60 (an example of a supply unit) to decrease the flow rate of the fluid supplied into the processing tub 27.

Accordingly, the upward movement of the substrates 8 during the time period taken before the substrates 8 reach the processing position after the substrates 8 come into contact with the etching liquid can be suppressed regardless of the restriction unit 103. Further, in the second exemplary embodiment, the restriction unit 103 is moved to the restriction position after the substrates 8 reach the processing position. However, the control unit 100 may move the restriction unit 103 to the restriction position before the substrates 8 are immersed, as in the first exemplary embodiment. Accordingly, the disorder of the arrangement of the substrates 8 during the time period taken before the substrates 8 reach the processing position after they come into contact with the etching liquid can be more securely suppressed.

Further, the flow of the etching liquid by the circulation unit 50 and the bubbling by the gas supply unit 60 may not necessarily be stopped completely. That is, by controlling the circulation unit 50, the control unit 100 may circulate the etching liquid at a flow rate smaller than a circulation flow rate of the etching liquid in the processing, specifically, at a flow rate at which the substrates 8 are not shaken. Further, by controlling the gas supply unit 60, the control unit 100 may supply the gas at a flow rate smaller than the supply flow rate of the gas in the processing, specifically, at a flow rate at which the substrates 8 are not shaken.

Moreover, in the second exemplary embodiment, both the circulation unit 50 and the gas supply unit 60 are controlled. However, the control unit 100 may control either one of the circulation unit 50 or the gas supply unit 60. By way of example, in comparison with the circulation of the etching liquid and the bubbling, there is a tendency that the bubbling causes the etching liquid to be shaken more strongly. Thus, by controlling the gas supply unit 60 before the substrates 8 are immersed in the etching liquid, the control unit 100 may stop or weaken only the bubbling while circulating the etching liquid at the same flow rate as that in the processing.

In case that only the bubbling is stopped or weakened, while stopping or weakening the bubbling, the control unit 100 may control the heater 54 of the circulation unit 50 to heat the etching liquid at a temperature lower than the heating temperature of the etching liquid in the processing. Accordingly, a temperature rise of the etching liquid as a result of the stopping or the weakening of the bubbling can be suppressed, so that the temperature of the etching liquid within the processing tub 27 can be maintained uniform. Further, a heater may be provided within the inner tub 45, and this heater may be controlled instead of the heater 54 of the circulation unit 50.

In addition, when moving the processed substrates 8 to the standby position from the processing position, the control unit 100 may control the elevating device 102 to move these substrates 8 to the standby position after stopping or weakening the circulation of the etching liquid and the bubbling.

Third Exemplary Embodiment

Now, a third exemplary embodiment will be discussed. In the above description, the immersion of the substrates 8 is not started until the shaking of the etching liquid within the processing tub 27 is settled down after the circulation of the etching liquid or the bubbling is stopped or weakened. However, in the third exemplary embodiment, it may be possible to monitor a movement of the etching liquid and start the immersion of the substrates 8 based on a monitoring result.

Figure 10:
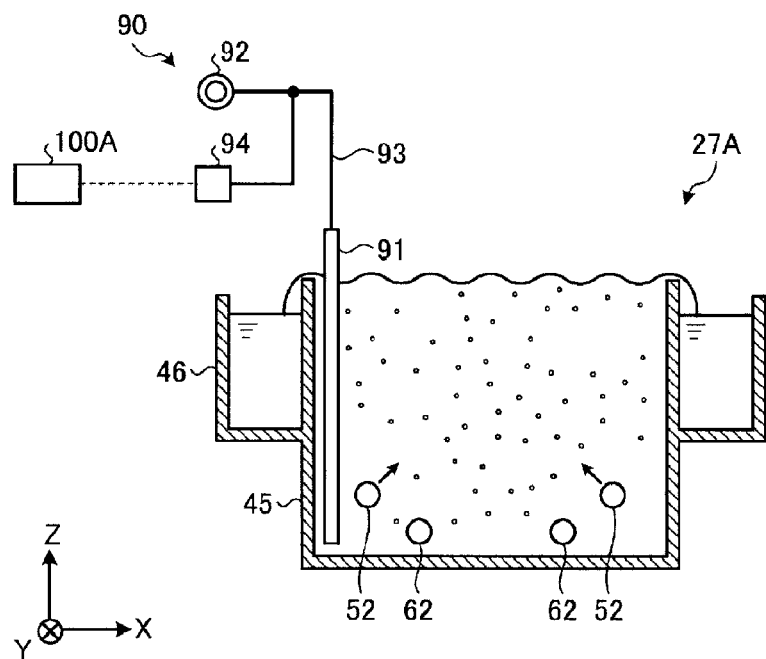
FIG. 10 is a diagram illustrating a configuration of a processing tub for etching according to a third exemplary embodiment.

FIG. 10 is a diagram illustrating a configuration of a processing tub for etching according to the third exemplary embodiment. In FIG. 10, illustrations of some components such as the circulation unit 50, the gas supply unit 60, the phosphoric acid aqueous solution supply unit 70 and the pure water supply unit 80 are omitted.

As shown in FIG. 10, a processing tub 27A according to the third exemplary embodiment is equipped with a head pressure sensor 90 configured to detect a head pressure of the etching liquid stored in the inner tub 45.

The head pressure sensor 90 is an example of a monitoring unit configured to monitor a movement of the etching liquid stored in the processing tub 27A, and is equipped with a bubble pipe 91, a gas source 92, a gas feed pipe 93 and a detection unit 94.

The bubble pipe 91 is inserted into the inner tub 45 such that a leading end thereof is exposed from a liquid surface of the etching liquid. The gas source 92 is a tank which stores a gas therein. By way of non-limiting example, the gas source 92 stores therein nitrogen. The gas feed pipe 93 supplies the nitrogen (purge gas) supplied from the gas source 92 to the leading end of the bubble pipe 91. The detection unit 94 is connected to a middle portion of the gas feed pipe 93, and is configured to measure a back pressure of the purge gas corresponding to a head pressure applied to the leading end of the bubble pipe 91 (that is, the head pressure of the etching liquid within the inner tub 45). A detection result from the detection unit 94 is outputted to a control unit 100A.

Further, the head pressure sensor 90 may not necessarily need to have the above-described configuration, and various other configurations thereof may be adopted as long as the head pressure sensor 90 is capable of detecting the head pressure of the etching liquid stored in the processing tub 27A.

Figure 11:
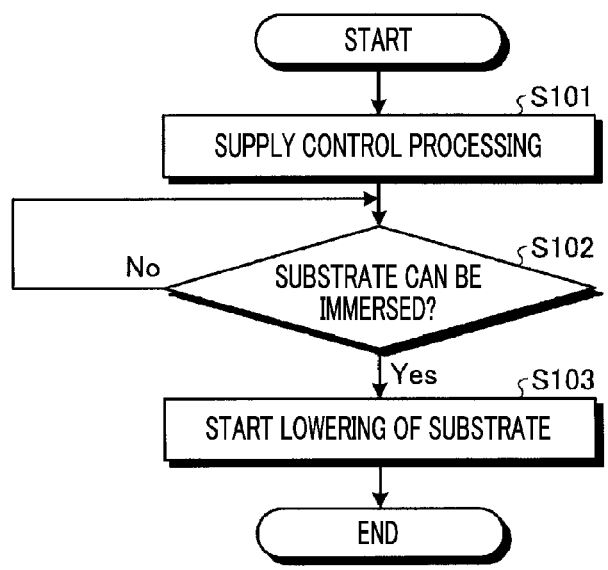
FIG. 11 is a flowchart showing a control sequence of controlling a substrate holding unit according to the third exemplary embodiment.

FIG. 11 is a flowchart for describing a control sequence for the substrate holding unit 29 in the third exemplary embodiment. FIG. 11 shows a control sequence up to a time when the multiple number of substrates 8 are begun to be moved down.

As depicted in FIG. 11, the control unit 100A performs a supply control processing of stopping or weakening at least one of the circulation of the etching liquid or the bubbling (process S101).

Then, the control unit 100A determines, based on the detection result by the head pressure sensor 90, whether it is possible to immerse the substrates 8 in the processing liquid stored in the processing tub 27A (process S102). For example, the control unit 100A makes a determination that the substrates 8 can be immersed if a value of the back pressure inputted from the detection unit 94 is equal to or less than a threshold value or if a variation (a difference between a maximum and a minimum) of the value of the back pressure inputted from the detection unit 94 per unit time is equal to or less than a threshold value. The control unit 100A repeats the determination of the process S102 until the value of the back pressure inputted from the detection unit 94 becomes equal to or less than the threshold value or until the variation of the value of the back pressure inputted from the detection unit 94 per unit time becomes equal to or less than the threshold value (process S102: No).

Meanwhile, if it is determined in the process S102 that the substrates 8 can be immersed (process S102: Yes), the control unit 100A starts to lower the multiple number of substrates 8 by controlling the elevating device 102 (process S103).

Here, though the head pressure sensor 90 is used as an example of the monitoring unit configured to monitor the movement of the etching liquid stored in the processing tub 27A, the monitoring unit may be an imaging unit such as, but not limited to, a CCD camera. In this case, the imaging unit images the liquid surface of the etching liquid within the processing tub 27A from above the processing tub 27A. The control unit 100A determines whether the substrates 8 can be immersed in the processing liquid stored in the processing tub 27A based on image data inputted from the imaging unit. For example, the control unit 100A makes a determination that the substrates 8 can be immersed if a variation of an image of the liquid surface of the etching liquid per unit time is equal to or less than a threshold value.

As stated above, if it is determined, based on the monitoring result by the head pressure sensor 90 or the imaging unit (an example of the monitoring unit), that the multiple number of substrates 8 can be immersed in the processing liquid stored in the processing tub 27A, the control unit 100A may control the elevating device 102 to move the substrates 8 supported by the supporting body 101 to the processing position. Accordingly, the substrates 8 can be suppressed from being begun to be moved down to the processing position before the shaking of the etching liquid within the processing tub 27A is sufficiently settled down.

Fourth Exemplary Embodiment

Figure 12:
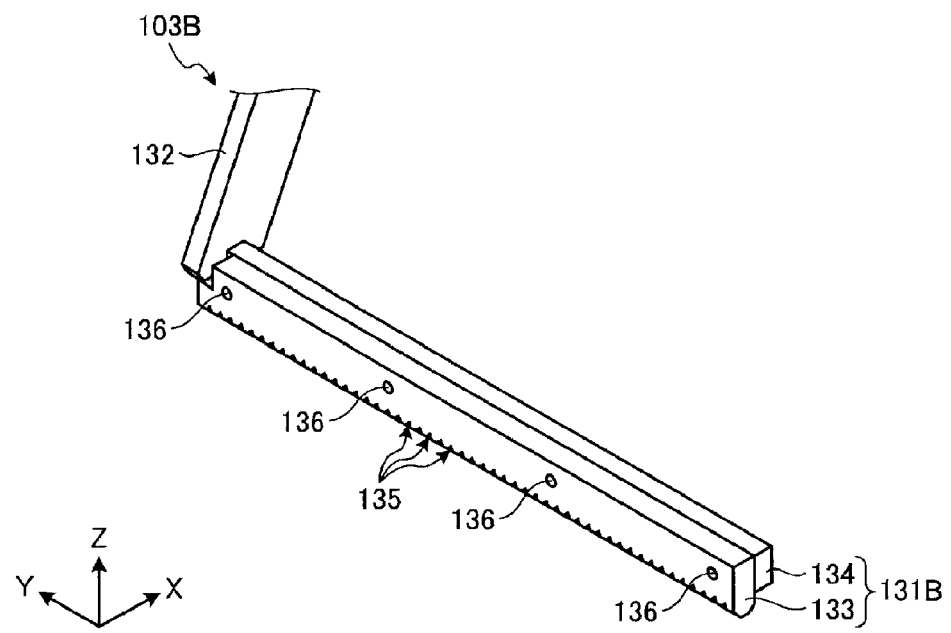
FIG. 12 is a diagram illustrating a configuration of a restriction member according to a first modification example of a fourth exemplary embodiment.
Figure 13:
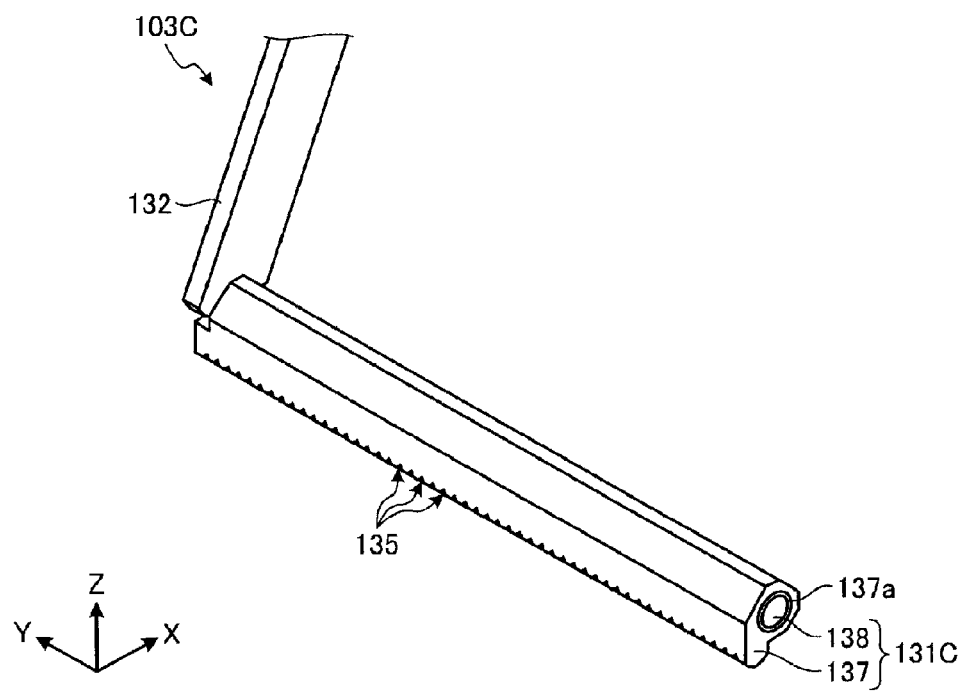
FIG. 13 is a diagram illustrating a configuration of a restriction member according to a second modification example of the fourth exemplary embodiment.
Figure 14:
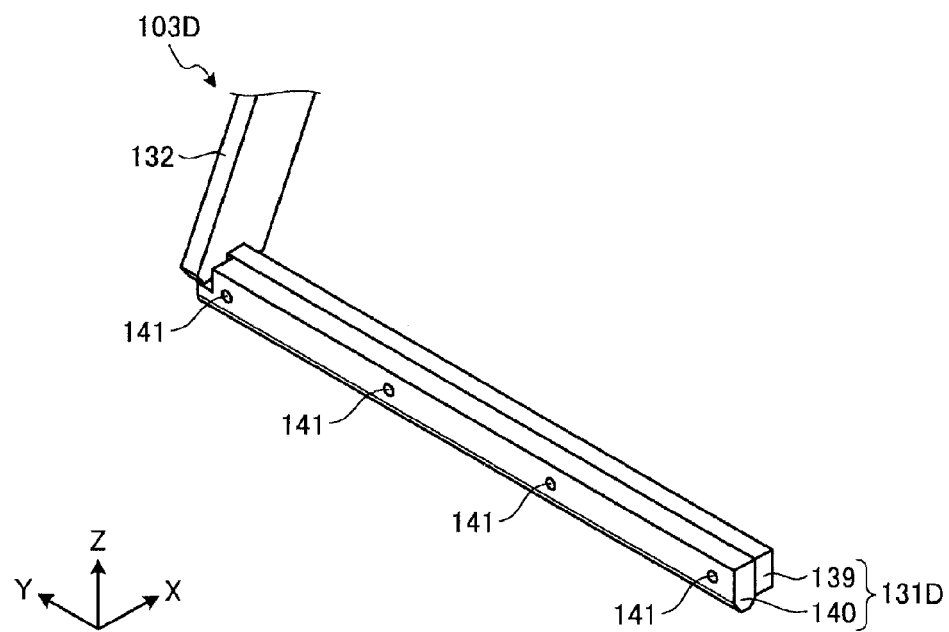
FIG. 14 is a diagram illustrating a configuration of a restriction member according to a third modification example of the fourth exemplary embodiment.

Now, a fourth exemplary embodiment will be explained. In the fourth exemplary embodiment, other configurations of the restriction member 131 of the restriction unit 103 will be explained with reference to FIG. 12 to FIG. 14. FIG. 12 to FIG. 14 are diagrams illustrating configurations of the restriction members according to a first modification example to a third modification example of the fourth exemplary embodiment.

As depicted in FIG. 12, a restriction unit 103B according to a first modification example of the fourth exemplary embodiment includes a restriction member 131B. The restriction member 131B includes a contact member 133, a supporting member 134 and a plurality of coupling members 136.

The contact member 133 has a multiple number of restriction grooves 135 and comes into contact with the upper portions of the substrates 8 which are moved up after being distanced apart from the supporting body 101 (see FIG. 3). The contact member 133 is made of a resin. As an example of the resin, PTFE (polytetrafluoroethylene) may be used.

The supporting member 134 is horizontally supported by the supporting arm 132 and configured to support the contact member 133 horizontally. The supporting member 134 is made of quartz.

The coupling members 136 may be, but not limited to, screws. As these coupling members 136 are inserted through screw holes (not shown) formed at the contact member 133 and the supporting member 134, the contact member 133 is fixed to the supporting member 134.

As stated above, in the restriction member 131B according to the first modification example, a part of the restriction member 131B which comes into contact with the upper portions of the substrates 8 is made of the resin. Thus, as compared to a case where this part is made of quartz, the particle generation that might be caused by the contact between the contact member 133 and the upper portions of the substrates 8 can be suppressed. Further, since the restriction member 131B has the configuration in which the contact member 133 made of the resin is supported by the supporting member 134 made of the quartz, the particle generation can be suppressed while maintaining strength of the restriction member 131B, as compared to a case where the whole restriction member 131B is formed of the resin.

As illustrated in FIG. 13, a restriction unit 103C according to a second modification example is equipped with a restriction member 131C. The restriction member 131C includes a contact member 137 and a supporting member 138.

The contact member 137 has a multiple number of restriction grooves 135 and comes into contact with the upper portions of the substrates 8 which are moved up after being distanced apart from the supporting body 101 (see FIG. 3). The contact member 137 is provided with an insertion through hole 137a extended along an arrangement direction of the restriction grooves 135. The insertion through hole 137a may have a circular cross sectional shape. However, the cross sectional shape of the insertion through hole 137a is not limited thereto, and the insertion through hole 137a may have a rectangular cross sectional shape. The contact member 137 is made of a resin such as PTFE.

The supporting member 138 is horizontally supported by the supporting arm 132 and supports the contact member 137 horizontally as it is inserted through the insertion through hole 137a of the contact member 137. The supporting member 138 may be formed to have a rounded rod shape or a rectangular rod shape to conform to the shape of the insertion through hole 137a of the contact member 137. Further, the supporting member 134 is made of quartz.

As stated above, in the restriction member 131C according to the second modification example, the supporting member 138 is inserted through the insertion through hole 137a provided at the contact member 137, so that the contact member 137 is fixed to the supporting member 138. Thus, as compared to the restriction member 131B according to the first modification example where the contact member and the supporting member are fixed by the coupling members 136, a load applied to the contact member 137 can be dispersed to the entire supporting member 138, so that thermal deformation may hardly occur.

As shown in FIG. 14, a restriction unit 103D according to a third modification example is equipped with a restriction member 131D. The restriction member 131D includes a contact member 140, a supporting member 139 and a plurality of coupling members 141.

The contact member 140 does not have the multiple number of restriction grooves 135, unlike the aforementioned contact members 133 and 137. This contact member 140 comes into contact with, on a contact surface thereof, the upper portions of the substrates 8 which are moved upwards after being distanced apart from the supporting body 101. The contact surface is a bottom surface of the contact member 140 in the state that the contact member 140 is placed at the restriction position, and the contact surface may be a flat surface or a curved surface protruding downwards. The contact member 140 is formed of a resin such as PTFE.

The supporting member 139 is horizontally supported by the supporting arm 132 and supports the contact member 140 horizontally. The supporting member 139 is made of a quartz. The coupling members 141 are, for example, screws, and as these coupling members 141 are inserted through screw holes (not shown) formed at the contact member 140 and the supporting member 139, the contact member 140 is fixed to the supporting member 139.

As stated above, the restriction member 131D according to the third modification example is not provided with the restriction grooves 135. With this configuration, it is still possible to suppress a substrate 8 from floating up and being moved to a placement position of a neighboring substrate 8. Further, as compared to the configuration having the restriction grooves 135, the particle generation that might be caused by a contact between the restriction member 131D and the substrates 8 can be more suppressed.

Here, the configuration in which the restriction grooves 135 are omitted from the contact member 133 according to the first modification example is described. However, a configuration of the restriction member without having the restriction grooves 135 is not limited to the mentioned example. By way of example, the restriction member without having the restriction grooves 135 may have a configuration in which the restriction grooves 135 are omitted from the contact member 137 according to the second modification example or a configuration in which the restriction grooves 135 are omitted from the restriction member 131 according to the first exemplary embodiment.

Other Exemplary Embodiments

In the above-described various exemplary embodiments, when placed at the restriction position, the restriction member is located at the position spaced apart from the substrates 8 appropriately supported by the supporting body 101. The restriction member, however, may be placed at a position where it comes into contact with the upper portions of the substrates 8 appropriately supported by the supporting body 101. With this configuration, the upward movement of the substrates 8 can be more securely restricted.

Further, though the restriction unit 103 is provided at the substrate holding unit 29 configured to immerse the substrates 8 into the processing tub 27 for etching, it may be possible to provide the restriction unit 103 at the substrate holding unit 30 configured to immerse the substrates 8 into the processing tub 28 for rinsing or at the substrate holding units 33 and 34 belonging to the cleaning apparatus 24. In addition, though the processing of selectively etching only the nitride film (SiN) between the nitride film and the oxide film ($SiO_2$) formed on the substrate 8 by using the phosphoric acid aqueous solution is described as an example of the etching processing, the etching processing may not merely be limited to the mentioned example.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A substrate processing apparatus, comprising:
   a substrate holding unit configured to hold multiple substrates;
   a processing tub configured to store a processing liquid therein;
   a gas supply unit configured to supply a gas into the processing tub; and
   a control unit configured to control the supply unit,
   wherein the substrate holding unit comprises:
   a supporting body having multiple supporting grooves each of which supports one of the multiple substrates with a vertically standing posture from below, respectively;
   an elevating device configured to move the supporting body between a standby position above the processing tub and a processing position within the processing tub; and
   wherein the control unit is further configured to:
   before the multiple substrates supported by the supporting body are immersed in the processing liquid stored in the processing tub,
   a) control the supply unit to decrease a flow rate of the gas to be supplied into the processing tub, and
   after the multiple substrates are immersed in the processing liquid, which has been determined that the multiple substrates have been allowed to be immersed in the processing liquid, and the multiple substrates reach the processing position,
   b) control the supply unit to increase the flow rate of the gas to be supplied into the processing tub such that the multiple substrates are to be processed.

2. The substrate processing apparatus of claim 1,
   wherein, in a), the control unit is configured to set the flow rate of the gas to be supplied to become zero.

3. The substrate processing apparatus of claim 1, further comprising:
   a monitoring device configured to monitor a movement of the processing liquid stored in the processing tub,
   wherein the control unit is further configured to control the elevating device to move the supporting body to the processing position when it is determined, based on a monitoring result by the monitoring unit, that the multiple substrates are allowed to be immersed in the processing liquid stored in the processing tub.

4. A substrate processing method, comprising:
   holding multiple substrates by supporting the multiple substrates with a vertical standing posture from below;
   immersing the multiple substrates in a processing liquid stored in a processing tub by lowering the multiple substrates from a standby position above the processing tub to a processing position within the processing tub; and
   supplying a gas into the processing tub in which the processing liquid is stored,
   wherein the supplying of the gas comprises:
   before the multiple substrates are immersed in the processing liquid stored in the processing tub,
   a) decreasing a flow rate of the gas to be supplied into the processing tub; and
   after the multiple substrates are immersed in the processing liquid, which has been determined that the multiple substrates have been allowed to be immersed in the processing, and the multiple substrates reach the processing position,
   b) increasing the flow rate of the gas to be supplied into the processing tub such that the multiple substrates are to be processed.

5. The substrate processing method of claim 4,
   wherein, in a), the flow rate of the gas to be supplied is set to become zero.

6. The substrate processing method of claim 4, further comprising:
   monitoring a movement of the processing liquid stored in the processing tub,
   wherein, in immersing of the multiple substrates, the multiple substrates are moved to the processing position when it is determined, based on a monitoring result by the monitoring, that the multiple substrates are allowed to be immersed in the processing liquid stored in the processing tub.

* * * * *